United States Patent [19]

Amick

[11] 4,235,643
[45] Nov. 25, 1980

[54] SOLAR CELL MODULE

[75] Inventor: James A. Amick, Princeton, N.J.

[73] Assignee: Exxon Research & Engineering Co., Florham Park, N.J.

[21] Appl. No.: 920,691

[22] Filed: Jun. 30, 1978

[51] Int. Cl.³ .............................................. H01L 31/04
[52] U.S. Cl. ..................................... 136/246; 136/251
[58] Field of Search ............. 136/89 PC, 89 EP, 89 H

[56] References Cited
U.S. PATENT DOCUMENTS

| | | | |
|---|---|---|---|
| 3,973,994 | 8/1976 | Redfield | 136/89 |
| 4,116,718 | 9/1978 | Yerkes et al. | 136/89 PC |

*Primary Examiner*—Aaron Weisstuch
*Attorney, Agent, or Firm*—Joseph J. Dvorak

[57] ABSTRACT

A solar cell module is provided having a plurality of circular solar cells arrayed on a support structure in which at least the land areas between the cells have facets with light reflecting surfaces. An optical cover medium couples the facets and the cells. Importantly the angular relationship of the facet surfaces is such that light impinging thereon will be reflected upwardly into the optical medium and then internally reflected downwardly toward an active cell area thereby effectively increasing the output of the module.

19 Claims, 6 Drawing Figures

SOLAR CELL MODULE

FIELD OF THE INVENTION

This invention relates to a technique for enhancing the output of solar cell modules. More particularly, the present invention relates to an improved solar cell module designed to utilize light impinging on areas between the cells which would normally not be utilized in photoelectric conversion, thereby increasing the power output of the cell.

BACKGROUND OF THE INVENTION

A solar cell array comprises a plurality of individual cells and interconnector means for electrically connecting adjacent cells in a matrix. Typically, the individual solar cells are arranged in columns and rows and the interconnector means are positioned so as to connect the cells in the requisite series and/or parallel circuit arrangement. The circuit arrangement, of course, depends upon the desired output voltage and current at the module peak power point.

Generally, for terrestrial applications, a solar cell array is fabricated and sold as a module comprising the solar cell array mounted on an electrically nonconductive support member having terminals provided therein. The module also has a top cover over the solar cell array. This cover is a transparent protective coating which protects the solar cells against environmental hazards and also serves to maintain the cells in proper position. The module typically is fitted into a metal frame which provides mechanical strength for the array and protects the solar cell array against damage due to environmental loadings, such as from wind, snow, ice, rain, etc. The metal frame also serves as a means for mounting the module at the proper angle to receive insolation.

The individual solar cells used in forming a solar cell array for terrestrial applications are circular discs or wafers having diameters generally in the range of 2 to 4 inches and formed from a polycrystalline silicon ingot which is melted, and then reformed into a cylindrical ingot of single crystalline silicon. The discs or wafers are then cut from the cylindrical ingot. These circular cells are quite common in commercial use because they are relatively less expensive per unit area than cells having another geometry. When the circular cells arre arrayed, however, the total active surface area of the array, i.e. of the solar cells, is less than the area required for mounting the array. Thus, not all the solar radiation which impinges on the module is utilized, since only some of the solar radiation impinges on active solar cell areas and some of the radiation impinges on inactive areas between the circular solar cells.

A number of techniques have been proposed for increasing the efficiency and effectiveness of solar cell modules by focusing incident solar radiation onto active cell areas. For example, mirrors and the like have been proposed to reflect solar radiation and concentrate the radiation in a given area. In this regard, see U.S. Pat. No. 3,990,914, wherein a tubular solar cell is described which is mounted in a parabolic mirror for concentration of solar radiation onto the solar cells. Also, mention should be made of U.S. Pat. No. 2,904,612 describing a reflector-type device in which the land areas between the circular solar cells consist essentially of inverted intersecting frustums of cones circumscribing the cells.

Another technique employed to enhance solar cell module output is the use of lenses. In U.S. Pat. No. 3,018,313, for example, a solar cell module is described which has an array of lenses covering the module so as to concentrate the light impinging on the cover of the solar cell array to converge downwardly toward the active solar cell area. In U.S. Pat. No. 4,053,327, yet another light focusing arrangement is described wherein the cover of a solar cell module comprises a plurality of converging lenses arranged so as to direct the light incident on the module so that it does not fall on the grid lines of the front electrode of the solar cells in the array. Yet another optical system for focusing incident radiation onto the solar cells so as to increase electric output and increase the efficiency of operation of such modules is disclosed in U.S. Pat. No. 4,042,417.

In addition to reflecting solar insolation from inactive areas of solar cell modules to the active areas of solar cells, it has also been proposed to use reflective surfaces below very thin solar cells so that light which penetrates the active solar cell area without being absorbed can be reflected back again to the active layer. See, for example, U.S. Pat. No. 3,973,994.

Notwithstanding the advantages made in the past in increasing the efficiency of solar cell modules, there still remains a very definite need for a solar cell module which will utilize all the light energy that is available as effectively and efficiently as possible and importantly without the necessity of complex, expensive and environmentally vulnerable optical systems.

SUMMARY OF THE INVENTION

Generally speaking, the solar cell module of the present invention comprises a plurality of circular solar cells arrayed on a support structure in which at least the land areas between the circular solar cells have a plurality of facets with light reflective surfaces, each facet having a predetermined angular relationship with respect to the planar surface of the support structure and each other so that light impinging thereon will be reflected upwardly into the optical cover medium and ultimately substantially backwards toward active areas of the cell. Preferably the facets will comprise a plurality of V-shaped grooves and the geometry of the groove will be such that incident light normal to the solar cell module will be reflected from the grooved surface toward the top surface of the optical medium and that the angle of incidence of such reflected light at the top surface of the optical medium will be greater than the critical angle.

Advantages and other features of the invention will be apparent from the specification which follows and from the drawings wherein like numerals are used throughout to identify like parts.

DETAILED DESCRIPTION OF THE INVENTION

As indicated hereinabove, in the practice of the present invention a plurality of circular solar cells are arrayed on a planar support structure in module fashion. One typical useful support structure for the arrayed circular solar cells is disclosed in U.S. Pat. No. 4,132,570, which patent is incorporated herein by reference. Other support structures may be employed in the practice of the present invention without departing from the spirit and scope hereof. Nonetheless, particular reference will be made herein to the support of U.S. Pat. No. 4,132,570.

Figure 1:
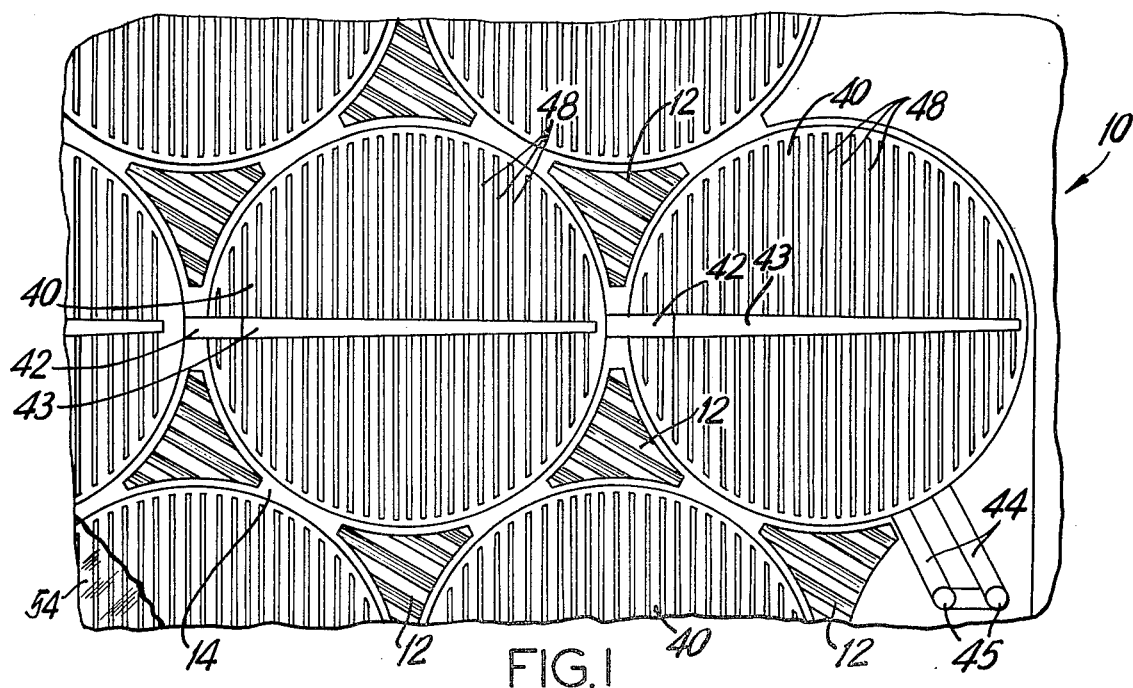
FIG. 1 is a fragmentary top plan view of a plurality of solar cells arrayed on a support structure.

Referring now to FIG. 1, there is shown a support structure 10 which is formed from an electrically nonconductive material such as high density, high strength plastic. Generally, support structure 10 will be rectangular in shape, although other shapes may be employed. Typically, dimensions for support structure 10 are 46 inches long by 15 inches wide by 2 inches deep.

Arrayed on the top surface of support structure 10 are a plurality of solar cells 40 shown in this instance connected in series by means of flexible interconnectors 42. Thus, the electrode on the bottom of one solar cell 40 is connected via flexible end connector 42 to the top bus bar 43 of the next succeeding solar cell 40. The bus bars 43 connect the electrically conductive fingers 48 on the surface of the cell. As is well known, these solar cells can be interconnected in other serial and/or parallel arrangements and are ultimately tied into a termination post such as posts 45.

In the embodiment shown in FIG. 1, the support structure has a plurality of circular wells on the surface thereof for receiving the solar cells and there are a plurality of gates 14 provided for interconnecting the solar cells in the desired fashion.

According to the present invention, the land areas 12, i.e. the area between the individual solar cells, are provided with facets with light reflective surfaces for reflecting light which normally impinges on the land area at an angle such that the reflected radiation, when it reaches the front surface of the optical medium covering the solar cell array, will be totally internally reflected back down to the back surface of the array. Thus, it is particularly important in the practice of the present invention that the solar cell array mounted on the support structure be coupled with an optically transparent cover material. In other words, there should be no air spaces between the solar cells and the optical medium or between the land areas and the optical medium. Typically, the optically transparent cover material will have an index of refraction generally between about 1.3 to about 3.0 and will be in the range of about $\frac{1}{8}$ inch up to about $\frac{3}{8}$ inch thick and preferably greater than about $\frac{1}{4}$ inch thick. Such an optically transparent cover material is shown as numeral 54 for example in FIG. 2.

The optically transparent cover material employed in the practice of the present invention, for example, may be any one of the silicone rubber encapsulating materials generally known to the electronics and solar cell industry or other ultra-violet stable and weather resistant plastics such as polycarbonates (Lexan), acrylics and urethanes, or a combination of one or more of the aforesaid polymer materials and glass.

Figure 2:
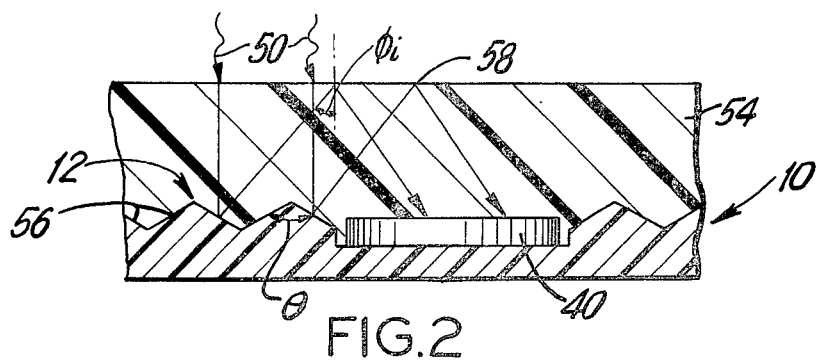
FIG. 2 is a fragmentary diagrammatic side elevation illustrating one embodiment of the present invention.

Referring still to FIG. 2, solar cells 40 are arrayed and mounted on support structure 10 and then covered by and coupled with an optically transparent layer 54. The land areas 12 between the solar cells 40 arrayed on the surface of the support structure 10 have facets having light reflective surfaces 56. The light reflective surfaces 56 may be mirrored surfaces, polished metal and the like. Forming such surfaces is well known and is not part of the subject invention.

Figure 3:
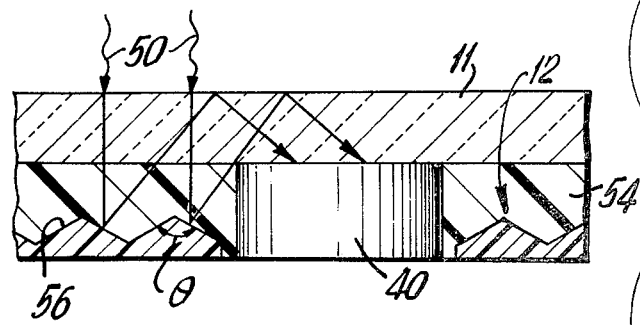
FIG. 3 is a diagrammatic fragmentary side elevation of an alternate embodiment of the present invention.

Referring now to the alternative embodiment of the present invention shown in FIG. 3, the circular solar cells 40 are supported by a rigid, planar, light transparent top support structure 11 which is formed from an electrically nonconductive material such as glass. A plurality of facets with light reflecting surfaces 56 are arranged in the land areas 12 between the solar cells 40. An optical medium 54 such as silicone encapsulant bonds the facets and cells to the support 11 as well as assures that there is no air space between the cells and the primary optical medium 11 or the facets and the primary optical medium 11.

As is shown in FIGS. 2 and 3, the facets preferably are in the form of V-shaped grooves. The depths of the grooves will generally be in the range of about 0.001" to 0.025" or approximately 0.1 of the thickness of the optically transparent cover material. The angle $\theta$ at the vertex formed by two upwardly sloping planes of the facets or grooves must be in the range of about 110° to 130° and preferably at an angle of 120°.

As is shown in FIGS. 2 and 3, the faceted region 12 is substantially coplanar with solar cells 40. Preferably the vertical height of the facet will be equal to the thickness of a solar cell and the facets will be arranged so that the facet will not extend below the bottom surface of the cell.

As can be seen in FIG. 2, normal vertically incident solar radiation designated, for example, generally by reference numeral 50 which impinges on normally inactive land areas 12 will be reflected by the reflecting surfaces 56 of the facets provided in the land area 12 so that the radiation re-enters the optical medium 54. When the reflected radiation reaches the front surface 58 of the optical medium, and if it makes an angle $\phi_i$ greater than the critical angle, the radiation will be totally trapped and reflected down to the back surface. The critical angle, of course, refers to the largest value which the angle of incidence may have for a ray of light passing from a more dense medium to a less dense medium. If the angle of incidence ($\phi_i$ in FIG. 2) exceeds the critical angle, the ray of light will not enter the less dense medium but will be totally internally reflected back into the denser medium.

The solar radiation which is internally reflected downwardly to the back surface on arrival can, of course, strike a solar cell rather than the land region, in which event it will be absorbed and contribute to the electric output of the module. This ability to redirect light striking inactive surfaces so that it will fall on active surfaces permits arraying of the cells at greater distances with minimum loss in output per unit area, hence raising the efficiency and/or lowering the cost per watt for a solar cell module.

Significantly, the geometry of the facets should be such that light reflected from surfaces 56 of the facets in land area 12 is not shadowed or blocked by an adjacent facet. Additionally, light upon being relected from surfaces 56 and land area 12 when it reaches the front surface 58 of the optical medium 54 must make an angle exceeding the critical angle with said front surface 58. Thus, the angle at the apex of the vertex of the groove desirably is in the range of 110° to 130° and preferably 120°. Also, it is preferred that the depth of the groove be about 0.3 millimeters.

As indicated, the surfaces 56 of the grooves on land area 12 can be smooth optically reflecting surfaces, i.e. they should have a solar absorptance less than 0.15. These surfaces can be prepared by coating machined or molded grooves with a suitable metal such as aluminum or silver, for example.

Figure 4:
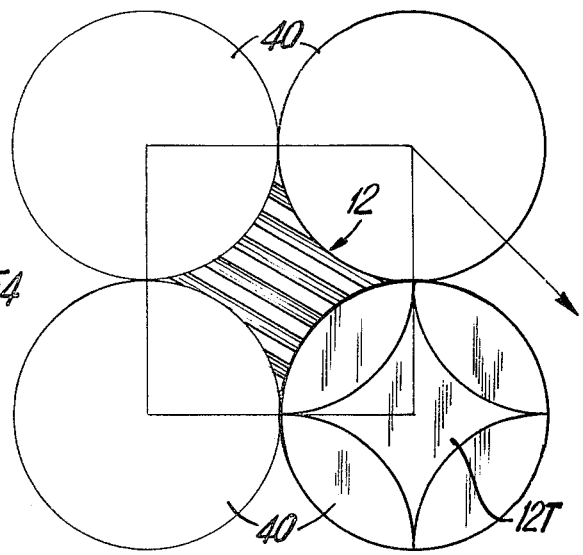
FIG. 4 is a diagrammatic illustration of a preferred arrangement of solar cells on the substrate of the present invention.

As will be readily appreciated, the facets or grooves on the land areas 12 provide a simple mechanism for reflecting light incident upon the facets in such a manner that the light is translated from the land regions between the cells onto adjacent cells where it can be collected. In FIG. 4, there is shown diagrammatically a particularly preferred arrangement of solar cells which provides for significant panel efficiency by translation of light from the inactive land areas onto an adjacent cell. As is shown in FIG. 4, if the cells 40 are arranged in a cubic close packed arrangement in which adjacent circular cells touch one another, the light striking faceted land area 12 is translated or redirected so as to fall on or strike an active cell 40. FIG. 4 illustrates the "mapping" of the redirected light from faceted land area 12 onto solar cell 40 by the shaded portion 12T.

Figure 5:
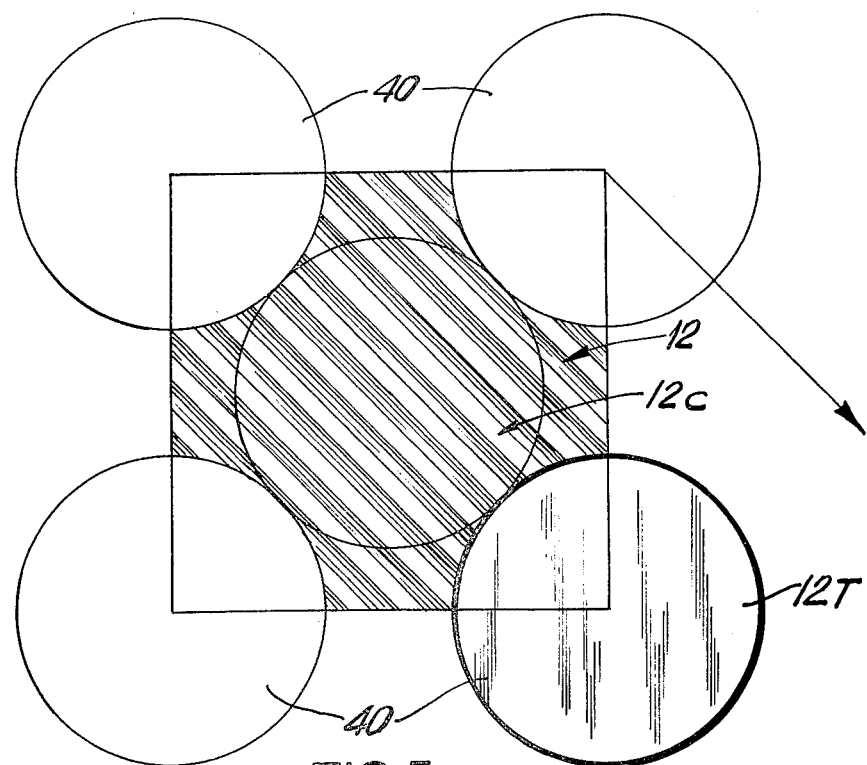
FIG. 5 is a diagrammatic illustration of another embodiment of the present invention.

In FIG. 5, an alternate arrangement of solar cells 40 is shown. Basically in this arrangement there is a cubic packed array in which every alternate wafer is removed. In this embodiment, the faceted land area 12 as well as the area 12C which normally would be covered by a solar cell has the grooves provided in it. As can be seen in this arrangement, the area from which the useful redirected light is available is not equal to the total inactive area between the cells. Nonetheless, there is a significant cost savings in this arrangement since the area within the circle where a solar cell would have been located has been translated onto an active area as shown by the shading 12T of FIG. 5 and the number of solar cells required for a given power output is effectively halved.

Figure 6:
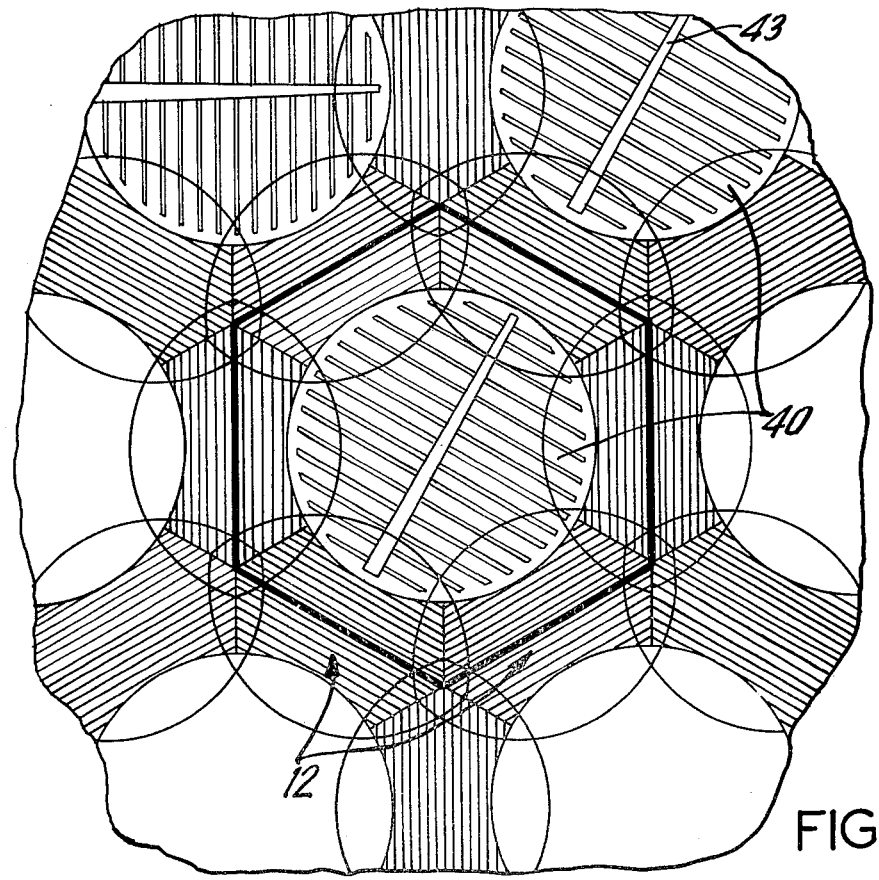
FIG. 6 is yet another diagrammatic illustration of another embodiment of the present invention.

In the embodiment shown in FIG. 6, a hexagonal array of solar cells 40 is provided. The grooved land areas 12 in this embodiment are more complex than in the embodiments previously described. The basic unit for this module is a hexagon having a circular solar cell 40 at its center. The grooves are always parallel to the edges of the hexagon in each of the 60° pie-shaped sectors. Each of the circlar solar cells 40 thereby collects half of the light from its own hexagon. An equivalent amount of light is collected from the 6 adjacent hexagons to give an output up to twice that available from the wafer alone without the grooved reflectors. The region from which the collection for the wafer will occur is shown as a hexagonal "flower" shaped region surrounding the central solar cell. This region can be visualized by displacing the circular cell equally in each of the six axial directions. For normal incidence light, the amount of the displacement is approximately equal to 3.4 times the thickness of the optical cover layer. For a cover layer ¼" thick, the displacement is about 0.85" along each of the six directions. For the drawing of FIG. 5, it can be seen that all of the grooved area falls within one or another of the appropriate extended collection regions. For light entering the optical medium at other than normal incidence, the lateral displacement upon reflection from the land areas followed by total internal reflection from the front surface of the optical medium will be different from that attained with normal incidence illumination. This effect can be partly compensated for by adjusting (a) the thickness of the optical cover medium, (b) the thickness of the optical bonding medium, (c) the vertex angle between the legs of the facets and (d) the index of refraction of the cover medium. Increasing the thickness of the optical cover medium, increasing the thickness of the optical bonding medium, decreasing the apex angle, and increasing the index of refraction for the cover material will increase the displacement for the reflected rays. Decreasing the thickness of the cover medium, decreasing the thickness of the bonding material, increasing the apex angle, and decreasing the index of refraction for the cover material will decrease the displacement for the reflected ray. Depending on the particular application, the area of the land regions can also be altered with respect to the area of the solar cells so that modest changes in the displacement of the reflected rays do not change the output power available from the individual solar cells appreciably.

The followng demonstration illustrates the type of improvement achievable in the practice of the present invention.

First, a single silicone solar cell was bonded via a transparent silicone elastomer to an iron-free glass plate 7/32" thick. A metallized hexagonal V-grooved structure was crudely constructed to surround the circular solar cell. This, too, was optically bonded to the glass plate with the transparent silicone. The arrangement was similar to that shown in FIG. 6. The facet regions were first masked with an optically opaque material, the cell was illuminated only by a solar simulator light source and the short circuit current was measured. The mask was then removed and the measurement was repeated. The observed short ciruit current in the latter instance was 30% greater than when the faceted light-reflective surface was masked.

What is claimed is:

1. A solar cell module comprising:
   a support structure having at least one planar surface adapted to support an array of solar cells;
   a plurality of circular solar cells arrayed on said at least one planar surface of said support structure, said cells having top and bottom surfaces;
   a light transparent optical medium coupled to said array and support structure;
   land areas between said arrayed circular solar cells, said land areas having a plurality of facets with light relfective surfaces, each facet having a predetermined angular relationship with respect to said planar surface of the support and each other so that light impinging on said light relective surfaces is relected upwardly through said optical medium and forms an angle at the opposite top surface of said module which is greater than the critical angle whereby said reflected light is internally reflected downwardly toward said solar cells.

2. The module of claim 1 wherein the optical medium has an index of refraction between 1.3 and 3.0.

3. The module of claim 2 wherein said optical medium is selected from the group consisting of plastics and a combination of plastics and glass.

4. The module of claim 3 wherein the angle between two upwardly angled facets is between 100° and 130°.

5. The module of claim 4 wherein the vertical height of said facets is equal to the thickness of said solar cells.

6. The module of claim 4 wherein said facets are substantially coplanar with the top surface of said solar cells.

7. The module of claim 4 wherein said facets comprise a plurality of V-shaped grooves.

8. The module of claim 7 wherein the angle at the vertex of upwardly extending sides of said groove is about 120°.

9. The module of claim 8 wherein said V-shaped grooves have a trough which extends downwardly a distance no greater than the bottom of said cells.

10. The module of claim 8 wherein said support is an electrically nonconductive plastic material and said cells are mounted on top planar surfaces of said support.

11. The module of claim 10 wherein said optical medium is a combination of plastics and glass.

12. The module of claim 11 wherein said plastic is a silicone rubber encapsulant.

13. The module of claim 8 wherein said support is an electrically nonconductive rigid light transparent material and said solar cells are arrayed on the bottom of said support and bonded thereto.

14. The module of claim 13 wherein said support is glass and wherein said module includes a light transparent silicone rubber encapsulant optical coupling medium between said glass and said cells and said facets.

15. A solar cell module comprising:
a structure adapted for supporting an array of solar cells;
a plurality of solar cells arrayed on said support structure;
land areas between said solar cells arrayed on said support structure;
a light transparent optical medium coupling said land areas and said solar cells, said optical medium having a top surface adapted to be disposed to receive incident solar radiation;
a plurality of facets having light reflective surfaces angularly disposed in said land areas whereby light falling on said reflective surfaces will be upwardly reflected through said optical medium to the top surface of said optical medium and thereafter internally reflected downwardly through said optical medium to said solar cells.

16. In a solar cell module having circular solar cells arrayed on a support structure having planar surfaces for mounting said array of solar cells, said module having a light transparent optical cover medium thereon, the improvement comprising:
a plurality of facets with light reflective surfaces thereon, said facets located at least in the land areas between the circular solar cells, each facet having a predetermined angular relationship with respect to the planar surfaces of the support structure and each other whereby light impinging on said facets will be reflected upwardly into the optical cover medium and then downwardly toward the circular solar cells.

17. The improvement of claim 16 wherein the facets comprise a plurality of V-shaped grooves and the geometry of said grooves is such that incident light normal to the solar cell module and which falls on the land areas between the cells will be reflected from the reflective surfaces of the grooves and which forms an angle at the top surface of the optical medium which is greater than the critical angle.

18. A solar cell module comprising:
a structure adapted for supporting an array of solar cells;
a plurality of solar cells arrayed on said support structure;
land areas between said solar cells arrayed on said support structure;
a light transparent optical medium coupling said land areas and said solar cells, said optical medium having an index of refraction of between 1.3 and 3.0;
a plurality of V-shaped grooves in said land areas having light reflective surfaces, said V-shaped grooves having upwardly extending legs meeting at a point and forming an angle therebetween, said angle being between 110° and 130°, whereby light falling on said reflective surfaces will be reflected upwardly through said optical medium to the front surface of said module and thereafter internally reflected downwardly to said solar cells.

19. A method of increasing the output current of a given solar cell module having a plurality of circular solar cells arrayed on a support and defining land areas therebetween comprising:
providing a plurality of facets with light reflective surfaces thereon in said land areas, and thereby
upwardly reflecting solar radiation impinging on said land areas into a light transparent optical medium adapted to internally reflect said radiation downwardly through said optical medium toward said solar cells whereby light impinging on said land area is translated to said solar cells thereby increasing the output current of said solar cell module.

* * * * *